United States Patent
Ullrich

(10) Patent No.: US 6,421,273 B1
(45) Date of Patent: Jul. 16, 2002

(54) ELECTRICALLY ERASABLE AND PROGRAMMABLE, NON-VOLATILE MEMORY DEVICE

(75) Inventor: Manfred Ullrich, Denzlingen (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/697,669

(22) Filed: Oct. 26, 2000

(30) Foreign Application Priority Data

Oct. 27, 1999 (DE) .......................................... 199 51 818

(51) Int. Cl.[7] ................................................ G11C 7/00
(52) U.S. Cl. ............................ 365/185.05; 365/185.07; 365/185.29; 365/203; 365/204
(58) Field of Search ....................... 365/189.01, 185.01, 365/185.05, 185.07, 185.29, 203, 204

(56) References Cited

U.S. PATENT DOCUMENTS

| 4,595,999 | A | * | 6/1986 | Betirac | 365/154 |
|---|---|---|---|---|---|
| 4,635,229 | A | * | 1/1987 | Okumura et al. | 365/154 |
| 5,682,345 | A | | 10/1997 | Roohparvar et al. | 365/185.04 |
| 5,696,716 | A | | 12/1997 | Rolandi | 365/185.21 |
| 5,742,542 | A | | 4/1998 | Lin et al. | 365/185.08 |
| 5,751,627 | A | * | 5/1998 | Ooishi | 365/145 |
| 5,864,499 | A | | 1/1999 | Roohparvar et al. | 365/185.08 |
| 6,104,644 | A | * | 8/2000 | Brigati | 365/189.07 |

* cited by examiner

Primary Examiner—Viet Q. Nguyen
(74) Attorney, Agent, or Firm—Samuels, Gauthier & Stevens, LLP

(57) ABSTRACT

A memory device comprises at least one electrically erasable and programmable non-volatile memory cell, a bistable flip-flop, connected in parallel with the memory cell, and a switching device, connected to the flip-flop, to connect at least one data input line to one of the status lines (QP, QN) of the flip-flop, in dependence on a switching signal.

13 Claims, 2 Drawing Sheets

|    | CHARGING | ERASING | PROGRAMMING | READING |
|----|----------|---------|-------------|---------|
| V2 | 5        | 12      | 12          | 5       |
| ER | 0        | 12      | 0           | 0       |
| S1 | 0        | 0       | 0           | 5       |
| S2 | 0        | 0       | 0           | 5       |
| S3 | 0        | 0       | 0           | 5       |
| S4 | 0        | 0       | 0           | 5       |
| V1 | 0        | 1,5     | 1,5         | 0       |
| LC | 5        | 0       | 0           | 0       |
| DI | D        | X       | X           | X       |

ELECTRICALLY ERASABLE AND PROGRAMMABLE, NON-VOLATILE MEMORY DEVICE

BACKGROUND OF THE INVENTION

The invention relates to semiconductor devices, and in particular to an electrically erasable and programmable, non-volatile memory device.

For numerous applications, for example for portable data media (chip cards), mobile data processing, wireless data and power transmission, safety equipment, and motor vehicles, it is necessary to store data in such a way that they remain preserved even if the power supply is turned off or fails. For this purpose, one uses not only data storage on magnetic media, which is expensive and requires a large amount of space and energy, but also electrically erasable and programmable, non-volatile semiconductor memories.

As known, there are two primary types of electrically erasable and programmable non-volatile semiconductor memories: (i) EEPROMs (electrically erasable and programmable read-only memories) and (ii) flash EPROMs (sometimes also called flash EEPROMs). EEPROMs use the well-known Fowler-Nordheim tunnel effect to erase and to program, while flash EPROMs use hot electron injection to erase the Fowler-Nordheim tunnel effect. As a rule, they share the feature of having at least two transistors, one of which has a floating gate. The floating gate is coupled to a tunnel diode arrangement, to charge the associated transistor as needed. Furthermore, at least one other transistor is used to activate or select the cell.

However, both EEPROMs and flash EPROMs take a relatively long time to program. In addition, they permit only a limited number of programming processes, and they are more prone to break down than other semiconductor memories. Consequently, EEPROMs and flash EPROMs have only restricted applicability for safety applications.

Therefore, there is a need for an electrically erasable and programmable non-volatile memory device that does not have these disadvantages.

SUMMARY OF THE INVENTION

Briefly, according to an aspect of the present invention, an electrically erasable and programmable non-volatile memory device includes a first electrically erasable and programmable non-volatile memory cell, which has a bit line, a selection line, a programming line, and an erase line. The memory device also includes a bistable flip-flop with two mutually inverted status lines, one of which is connected to the bit line of the memory cell, while the other one is connected to the programming line of the memory cell. The memory device further includes a switching device, connected to the flip-flop, to connect at least one data input line to one of the status lines of the flip-flop, in dependence on a switching signal.

A feature of the inventive memory device is that its outputs are valid constantly and without significant delay, because these outputs receive the data before the device is actually programmed, so that their effects on other circuit components can be tested before the actual programming process, and these components can be modified as necessary, already before programming. This avoids unnecessary reprogramming and thus an unnecessary shortening of the lifetime of the memory device.

To charge the memory device, the data input line(s) is/are connected to the bit line(s), and the flip-flop is supplied with a low voltage. For erasing the memory device, the flip-flop is supplied with a higher voltage, and the erase line of the memory cell is driven with the higher voltage. For programming the memory device, the flip-flop is supplied with the higher voltage. Finally, for reading the memory device, the flip-flop is supplied with the low voltage, and the selection line of the memory cell is driven with the low voltage.

In a preferred embodiment, a second electrically erasable and programmable non-volatile memory cell is present. The bit line and the erase line of the second memory cell are connected to the bit line and the erase line of the first memory cell, respectively. The selection line of the second memory cell is driven like the first memory cell to charge, erase, program, and read the memory device. The second memory cell increases redundancy and consequently improves the entire device's security against breakdown of one memory cell.

In yet another embodiment, at least one other electrically erasable and programmable non-volatile memory cell is present. The bit line and the erase line of the other memory cell(s) are coupled to the erase line (ER) and the bit line of the first memory cell, respectively, in such a way that when the memory device is being charged or read, the drive of the other memory cell(s) is the same as the respective drive of the first memory cell, and while the memory device is being erased and programmed, the drive of the other memory cell(s) is the same as the drive of the first memory cell. This feature further increases redundancy and thus improves security, since a systematic error on both sides of the bistable flip-flop can be detected and eliminated through the inverse drive of at least one other memory cell. To check the states of the individual memory cells, the selection lines of the memory cells preferably are also driven individually.

To test the memory device with an appropriate switching signal, for example by appropriately actuating the data input lines, all the memory cells can be brought to the same state, and then read out individually. The functionality of each memory cell, before and after erasing and/or programming, can thus be determined. For programming, the selection line(s) of the memory cell(s) preferably are not actuated in this case.

A switching device may switch the data input lines to the status lines of the flip-flop, which assumes a high-ohm state in the absence of a switching signal. Such switching devices thus can have, for example, a tri-state output. A controllable switch for data lines can thus be realized without great complication.

In a preferred design of the inventive memory arrangement at least one memory cell has a floating gate transistor, whose source connection is connected to a reference point, whose drain connection is connected to the bit line via the controlled section of a selection transistor, and whose gate connection is coupled, on the one hand, via a tunnel capacitance to the erase line and, on the other hand, via the gate source section of an injector transistor to the programming line. Advantageously, this inexpensively creates a reliable flash EPROM cell.

The bistable flip-flop and the memory cell(s) may have a common reference point. Here, as also in other design forms, the reference point can be shifted for erasing and programming to protect other circuit components. This arrangement preferably has an output circuit, which is connected to at least one status line of the flip-flop, and whose cross current does not rise significantly when the reference point rises.

Accordingly, a switching device can also be present, to connect the data input line(s) to the status line(s) of the flip-flop, to change the level and/or to adapt the reference point, and to compensate the rise of the reference point in view of the data input lines.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
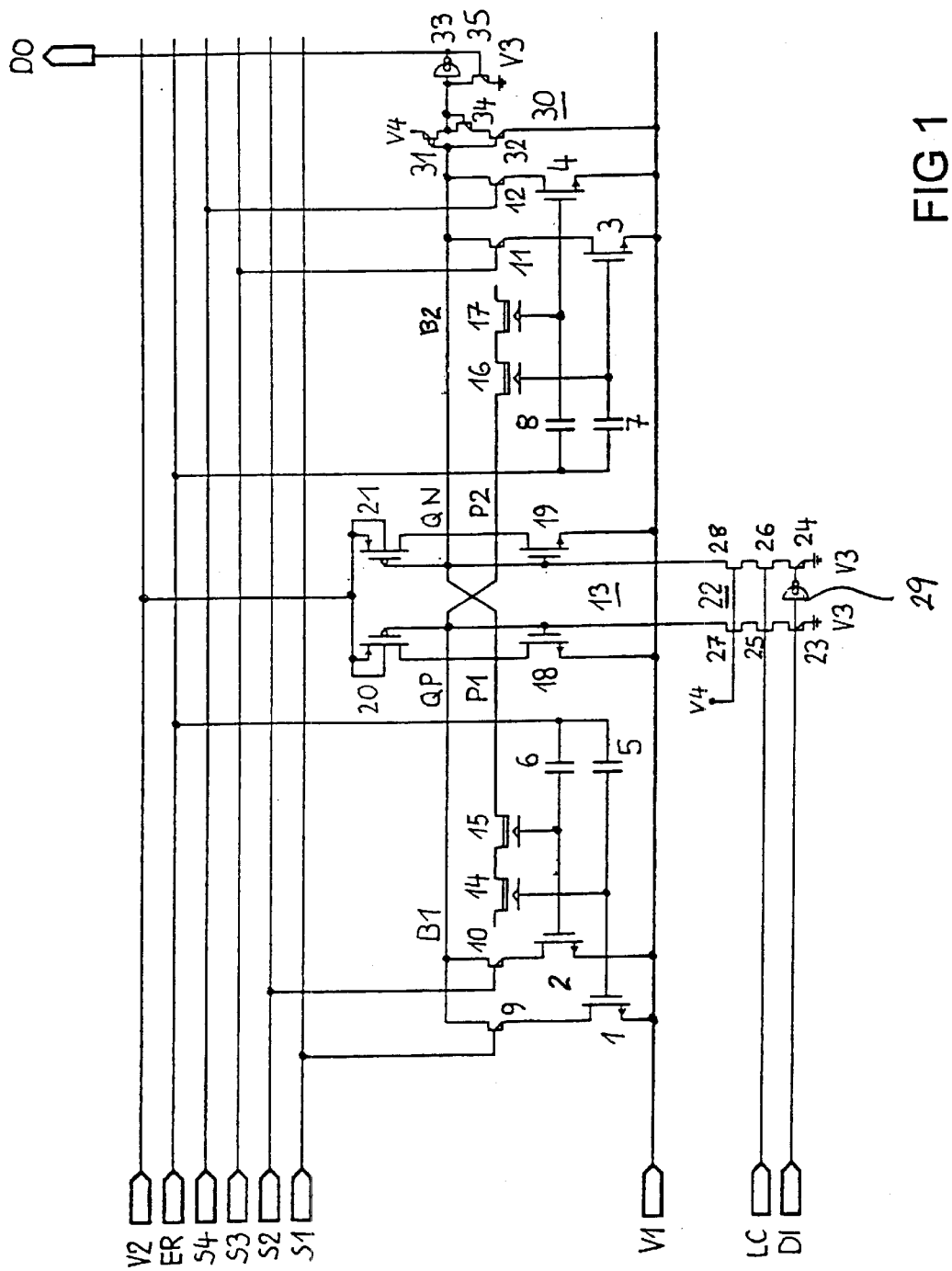
FIG. 1 illustrates a circuit diagram of an embodiment of an inventive memory device.

FIG. 1 is a circuit diagram of a memory device that includes four electrically erasable and programmable non-volatile memory cells, each of which has an MOS field effect transistor 1–4 with a floating gate. The source side of each MOS field effect transistors 1–4 is connected to a first supply line V1, and each gate side is connected, via an associated tunnel capacitance 5–8, to a common erase line ER.

The drain connections of the MOS field effect transistors 1, 2 are connected to a common bit line B1 via the controlled path of an associated selection transistor 9, 10, respectively. The control connections of the selection transistors 9 and 10 are connected to selection line S1, S2, respectively. The drain connections of the MOS field effect transistors 3 and 4 of the third and fourth cells are connected to a common bit line B2 via the controlled path of an associated selection transistor 11, 12, respectively. The control connections of the selection transistors 11 and 12 are connected to selection lines S3, S4, respectively.

The gate connections of the MOS field effect transistors 1, 2 of the first and second cells are connected to the gate connections of injector transistors 14, 15, respectively, which inject hot electrons into the respective floating gate. The injector transistors 14, 15 source connections are coupled to the bit line B2, forming a programming line P1. The gate connections of the MOS field effect transistors 3, 4 of the third and fourth cells are connected to the gate connections of injector transistors 16, 17, respectively. The injector transistors 16, 17 source connections on their part are connected to the bit line B1, forming a program line P2.

The bit lines B1 and B2 are connected to mutually inverted status lines QP, QN, respectively, of a flip-flop 13. The flip-flop 13 includes two n-type MOS field effect transistors 18, 19. The source connections of the transistors 18, 19 are connected to the supply line V1, and the gate connections are coupled to the drain connections of the other MOS field effect transistor 19, 18, respectively. The drain connections of both MOS field effect transistors 18, 19 are connected respectively to the drain connections of two p-type MOS field effect transistors 20, 21. The source connections of the transistors 20, 21 are coupled to one another and to a supply line V2. The gate connections of the MOS field effect transistors 18 and 20, as well as the gate connections of the MOS field effect transistors 19 and 21, are respectively connected to one another and are coupled to the drain connections of the MOS field effect transistors 19 and 21, and respectively to the drain connections of the MOS field effect transistors 18 and 20, yielding the status lines QN and QP.

The coupled gate connections of the MOS field effect transistors 18 and 20 on the one hand, and the coupled gate connections of the MOS field effect transistors 19 and 21 on the other hand, are respectively connected to the outputs of a switching device 22. The switching device 22 is controlled through a control line LC, and it connects a data input line DI, non-inverted and inverted, to the coupled gate connections of the MOS field effect transistor 18, 20 and 19, 21, respectively. The switching device 22 includes six transistors 23–28. The controlled paths of three transistors 23, 25, 27 are connected sequentially and between the coupled gate connections of the MOS field effect transistors 18, 20 and a reference potential V3. The controlled paths of the transistors 24, 26, 28 are also connected sequentially and between the coupled gate connections of the MOS FETs 19, 21 and a reference potential V3. The control connections of the transistors 23 and 24, which are situated nearest the reference potential V3, are coupled to the data input line DI such that the control connection of the transistor 23 is connected directly to the data input line DI, and the control connection of the transistor 24 is connected to the same data input line through an intermediate inverter 29. The control connections of the transistors 27 and 28, which face the MOS field effect transistors 18, 19, 20, and 21, are connected to a supply line V4 to ensure a constant supply potential for the transistors 23–26. The control connections of the in-between transistors 25 and 26 are connected to one another as well as to the control line LC. The transistors 25 and 26 cause the data input line DI to be switched to the flip-flop 13, and thus cause the storage of the state of the flip-flop 13, which appears on the data input line DI (setting the flip-flop 13).

An output stage 30 follows the bit line B2 or respectively the status line QN of the flip-flop 13. The output stage 30 comprises two transistors 31, 32, whose control connections are connected to the bit line B2 and respectively to the status line QN of the flip-flop 13. The controlled section of the transistor 31 is connected between the supply line V4 and the input of an inverter 33. The controlled section of transistor 32 is connected in series with the controlled section of a transistor 34 as well as between the supply line V1 and the input of the inverter 33. In addition, the input of the inverter 33 is connected to the control connection of transistor 34 and, via the controlled section of transistor 35, to the reference potential V3. The control connection of the transistor 35 is connected to the output of the inverter 33 which forms the data output line DO.

Figures 2, 3:
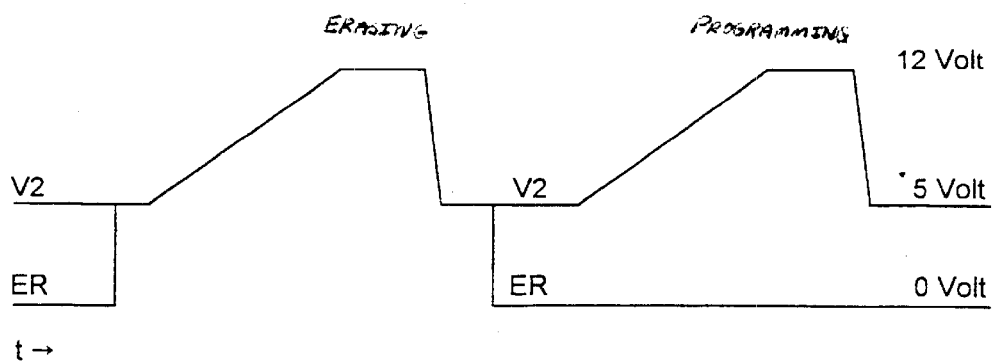
FIG. 2 is a table illustrating the logical behavior of various signals in the embodiment of FIG. 1.
FIG 3 is a diagram illustrating the time progress of two selected signals during the erasing and programming process in the embodiment of FIG. 1.

FIG. 2 shows the level on the supply line V2, on the erase line ER, on the selection-lines S1 to S4, of the reference potential V1, the control line LC, and the data input line DI, all relative to the reference potential V3, under various operating conditions, such as, for example, charging, erasing, programming, and reading. When a data item D present on the data line DI is loaded into the flip-flop 13, 5 volts relative to the reference potential V3 appear on the supply line V2 and on the control line LC. The selection lines S1–S4, the erase line ER, and the supply line V1 are at 0 volts. In contrast, during an erase operation, the voltage on the supply line V2 rises from 5 volts to 12 volts, the voltage on the supply line V1 from 0 to 1.5 volts, and the voltage on the erase line ER from 0 to 12 volts. The control line LC changes its level from 5 to 0 volts, while the data input line DI can carry an arbitrary value X, since in any case it is not connected to the flip-flop 13. The selection lines S1–S4 remain at 0 volts.

During programming, the supply line V1 carries 1.5 volts, and the supply line V2 carries 12 volts. Apart from the data input line DI with its arbitrary level X, the remaining lines stand at 0 volts. Finally, during reading, the data input line DI again has an arbitrary level X, but the supply line V1, the control line LC, and the erase line ER stand at level zero, while the supply line V2 and the selection lines S1 to S4 carry a level of 5 volts.

The data item D is entered into the flip-flop 13 via the data input line DI, with a HIGH level on the control line LC. Referring to FIG. 3, the supply line V2 here goes from LOW to HIGH, which in this case is a transition from a low value (e.g., 5 V) to a higher value (e.g., 12 V). The erase line ER and the selection lines S1–S4 remain LOW (e.g., 0 V). The data item is thus ready at the data output line DO, and its effect on subsequent circuit components can already be tested. For example, for electronic equalization of sensors, all bits can very simply be set sequentially, if an arrangement in accordance with FIG. 1 is used for each bit. During erase, on the other hand, the erase line ER goes from 0 volts to 5 volts, while the process on the supply line V2 corresponds to that during programming. Over the time t, the level on the supply line V2, with a given time delay relative to the rectangular rise of the level on the erase line ER from 5 volts to 12 volts, and remains at 12 volts until shortly before the next level transition on the erase line ER.

Programming (i.e., non-volatile storing) occurs in such a way that the MOS field effect transistors 1–4 with floating gate are controlled non-conducting on one side of the flip-flop and conducting on the other side. To make them non-conducting, the erase line ER and the supply line V2 are driven to a high programming voltage (e.g., 12 volts); to make the opposite side conducting, only the supply line V2 goes to the high programming voltage, while the erase line ER remains at zero. Which side becomes conducting and which non-conducting depends on the wiring of the flip-flop 13 and on the data D entered into the flip-flop 13. During programming, the selection lines S1–S4 must remain at zero. After programming, the supply line V2 goes to the normal operating voltage (e.g., 5 volts), while the erase line ER goes to zero or remains at zero.

To check the states of the MOS field effect transistors 1–4 with floating gate, each individual MOS field effect transistor 1–4 with floating gate can be tested for its status by a suitable sequencing of the selection lines S1 to S4, and of the data input line DI, as well as the control line LC. During programming, the supply line V1 assumes a voltage a little above zero volts (e.g., 1.5 volts), in order to protect circuit components. The special output circuit ensures that no cross current flows even during programming (because of the higher level on the supply line V1) and that the data item D remains preserved at the output.

In addition, it is possible to make both sides and thus all MOS field effect transistors 1–4 with floating gate conducting, and to test this state after a lifetime load. The data can also be entered through shift registers, and possibly can also be read out by shift registers, via another common output.

Although the present invention has been shown and described with respect to several preferred embodiments thereof, various changes, omissions and additions to the form and detail thereof, may be made therein, without departing from the spirit and scope of the invention.

What is claimed is:

1. An electrically erasable and programmable non-volatile memory device, comprising:
   a first electrically erasable and programmable non-volatile memory cell, which has a bit line, a selection line, a programming line, and an erase line;
   a bistable flip-flop with two mutually inverted status lines (QP, QN), one of which (QP) is connected to said bit line of said memory cell, while the other one (QN) is connected to said programming line of said memory cell; and
   a switching device, connected to said flip-flop, to connect at least one data input line (DI) to a selected one of said status lines (QP, QN) of said flip-flop as selected based upon the state of a switching signal (LC).

2. The memory device of claim 1, wherein:
   to charge said memory device, said data input line(s) are connected to said status line(s) (QP, QN), and said flip-flop is supplied with a low voltage;
   for erasing said memory device, said flip-flop is supplied with a higher voltage, and said erase line (ER) of said memory cell is driven with the higher voltage;
   for programming said memory device, said flip-flop is supplied with the higher voltage; and
   for reading said memory device, said flip-flop is supplied with the low voltage, and said selection line of said memory cell is driven with the low voltage.

3. The memory device of claim 1, comprising:
   a second electrically erasable and programmable non-volatile memory cell that includes a second cell bit line and a second cell erase line connected to said bit line and respectively said erase line of said first memory cell, and a second cell selection line of said second memory cell is driven to charge, erase, program, and read the memory device.

4. The memory device of claim 3, comprising:
   a third electrically erasable and programmable non-volatile memory cell that includes a third cell bit line and a third cell erase line coupled to said erase line and respectively said bit line of said first memory cell such that, when the memory device is being charged or read, said drive of said third memory cell is the same as the respective drive of said first memory cell and, while the memory device is being erased and programmed, the drive of said third memory cell is the same as the drive of said first memory cell.

5. The memory device of claim 3, wherein to test the states of said first or second memory cells, the selection lines of said first and second memory cells are driven individually.

6. The memory device of claim 5, wherein to test the memory device by driving said data input lines with an appropriate switching signal, all said memory cells are brought to the same state, and subsequently are read out individually.

7. The memory device of claim 6, wherein for programming, the selection line of said first memory cell is not driven.

8. The memory device of claim 3, comprising a switching device to connect said data input line to said status lines (QP, QN) of said flip-flop, which assumes a high-ohm state in the absence of said switching signal.

9. The memory device of claim 1, wherein said first memory cell has a floating gate transistor, whose source connection is connected to a reference voltage potential, whose drain connection is connected to said bit line via the controlled section of a selection transistor, and whose gate connection is switchably coupled either via a tunnel capacitance to the erase line or via the gate source section of an injector transistor to said programming line.

10. The memory device of claim 1, wherein said bistable flip-flop and said first memory cell are connected to a common reference voltage potential.

11. The memory device of claim 10, wherein to erase and program the memory device, the voltage value at said reference voltage potential is shifted.

12. The memory device of claim 11, comprising an output circuit connected to at least one status line of said flip-flop, and whose cross current does not increase significantly when the voltage value of the reference voltage potential increases.

13. The memory device of claim 11, comprising a switching device to connect said data input line to said status lines (QP, QN) of said flip-flop, which has means for changing the voltage value at said reference voltage potential.

* * * * *